US012168605B2

(12) United States Patent
Hsiao et al.

(10) Patent No.: US 12,168,605 B2
(45) Date of Patent: Dec. 17, 2024

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Hsu-Liang Hsiao, Kaohsiung (TW); Lu-Ming Lai, Kaohsiung (TW); Ching-Han Huang, Kaohsiung (TW); Chia-Hung Shen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 605 days.

(21) Appl. No.: 17/330,245

(22) Filed: May 25, 2021

(65) Prior Publication Data

US 2021/0276860 A1   Sep. 9, 2021

Related U.S. Application Data

(63) Continuation of application No. 15/599,377, filed on May 18, 2017, now Pat. No. 11,014,806.

(51) Int. Cl.
*B81C 3/00*   (2006.01)
*B81C 1/00*   (2006.01)

(52) U.S. Cl.
CPC .......... *B81C 3/001* (2013.01); *B81C 1/00269* (2013.01); *B81B 2203/0127* (2013.01); *B81B 2203/0315* (2013.01); *B81B 2203/033* (2013.01)

(58) Field of Classification Search
CPC ........... B01L 3/502707; B81C 1/00047; B81C 1/00055; B81C 1/00119; B81C 3/001;
(Continued)

(56) References Cited

U.S. PATENT DOCUMENTS 6,115,326 A   9/2000   Puma et al.
6,594,369 B1 *  7/2003   Une .................... H04R 19/016
                                                                          381/174
(Continued)

FOREIGN PATENT DOCUMENTS

CN   102479763 A   5/2012
CN   202425037 U   9/2012
(Continued)

OTHER PUBLICATIONS

Search Report with English translation for corresponding Chinese Patent Application No. 201711372439.7, issued May 11, 2023, 6 pages.

(Continued)

*Primary Examiner* — Michelle Mandala
*Assistant Examiner* — Kevin Quinto
(74) *Attorney, Agent, or Firm* — FOLEY & LARDNER LLP

(57) ABSTRACT

At least some embodiments of the present disclosure relate to a semiconductor device package. The semiconductor device package includes a substrate with a first groove and a semiconductor device. The first groove has a first portion, a second portion, and a third portion, and the second portion is between the first portion and the third portion. The semiconductor device includes a membrane and is disposed on the second portion of the first groove. The semiconductor device has a first surface adjacent to the substrate and opposite to the membrane. The membrane is exposed by the first surface.

16 Claims, 8 Drawing Sheets

(58) Field of Classification Search
CPC .......... B81C 1/00269; B81C 1/00277; B81C 1/00293; B81B 2203/0127; B81B 2203/0315; B81B 2203/033; B81B 7/0035; B81B 7/0041
See application file for complete search history.

(56) References Cited

U.S. PATENT DOCUMENTS

| | | | |
|---|---|---|---|
| 9,420,378 B1* | 8/2016 | Syed | H04R 19/04 |
| 2009/0305502 A1* | 12/2009 | Lee | H01L 23/481 |
| | | | 257/E21.597 |
| 2012/0126388 A1 | 5/2012 | Lin et al. | |
| 2015/0259194 A1* | 9/2015 | Lin | B81C 1/0023 |
| | | | 257/773 |
| 2015/0340332 A1* | 11/2015 | Rinne | H01L 24/13 |
| | | | 257/737 |
| 2016/0056080 A1 | 2/2016 | Takahashi et al. | |
| 2016/0133537 A1 | 5/2016 | Shih et al. | |
| 2016/0273989 A1 | 9/2016 | Brida et al. | |

FOREIGN PATENT DOCUMENTS

| | | |
|---|---|---|
| CN | 104760924 A | 7/2015 |
| CN | 105340065 A | 2/2016 |
| CN | 106158773 A | 11/2016 |
| CN | 206116374 U | 4/2017 |
| DE | 10159091.7 A1 | 6/2003 |

OTHER PUBLICATIONS

Second Office Action for corresponding Chinese Patent Application No. 201711372439.7, issued May 11, 2023, 14 pages.
Final Office Action for U.S. Appl. No. 15/599,377, issued Jan. 9, 2019, 13 pages.
Non-Final Office Action for U.S. Appl. No. 15/599,377, issued May 8, 2018, 15 pages.
Non-Final Office Action for U.S. Appl. No. 15/599,377, issued, Jan. 13, 2020, 21 pages.
Non-Final Office Action for U.S. Appl. No. 15/599,377, issued, Jul. 23, 2020, 8 pages.
Non-Final Office Action for U.S. Appl. No. 15/599,377, issued, Jun. 26, 2019, 17 pages.
Notice of Allowance for U.S. Appl. No. 15/599,377, issued, issued Jan. 26, 2021, 7 pages.
First Office Action for corresponding Chinese Patent Application No. 201711372439.7, issued Dec. 12, 2022, 9 pages.
Search Report with English translation for corresponding Chinese Patent Application No. 201711372439.7, issued Dec. 12, 2022, 6 pages.

* cited by examiner

SEMICONDUCTOR DEVICE PACKAGE AND A METHOD OF MANUFACTURING THE SAME

CROSS-REFERENCE TO RELATED APPLICATION

This application is a continuation of U.S. patent application Ser. No. 15/599,377 filed May 18, 2017, the contents of which is incorporated herein by reference in its entirety.

BACKGROUND

1. Technical Field

The present disclosure relates to a semiconductor device package, and more particularly to a semiconductor device package having a substrate with an air release structure.

2. Description of the Related Art

A microelectromechanical system (MEMS) chip may include a membrane and a lid. The lid of the MEMS chip may be attached to a substrate by glue to form a semiconductor package. During the manufacturing process, the semiconductor package may be heated to cure the glue between the lid and the substrate. However, the thermal cycle may cause expansion of air within the semiconductor package and therefore may damage the membrane.

SUMMARY

In some embodiments, according to an aspect, a semiconductor device package includes a substrate with a first groove and a semiconductor device. The first groove has a first portion, a second portion, and a third portion, and the second portion is between the first portion and the third portion. The semiconductor device is disposed on the second portion of the first groove. The semiconductor device includes a membrane and has a first surface adjacent to the substrate and opposite to the membrane. The membrane is exposed by the first surface.

In some embodiments, according to another aspect, a carrier includes a core layer, a semiconductor device mounting area on the core layer, and a first groove disposed on the core layer and exposed from the core layer. The first groove crosses over the semiconductor device mounting area.

In some embodiments, according to still another aspect, a method is disclosed for manufacturing a semiconductor device package. The method includes: providing a carrier, a semiconductor device mounting area being defined on the carrier; forming a groove on the carrier, the groove exposed from the carrier and crossing over the semiconductor device mounting area; and attaching a semiconductor device including a membrane to the semiconductor device mounting area of the carrier through an adhesive to form the semiconductor device package.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

DETAILED DESCRIPTION

Figure 1A:
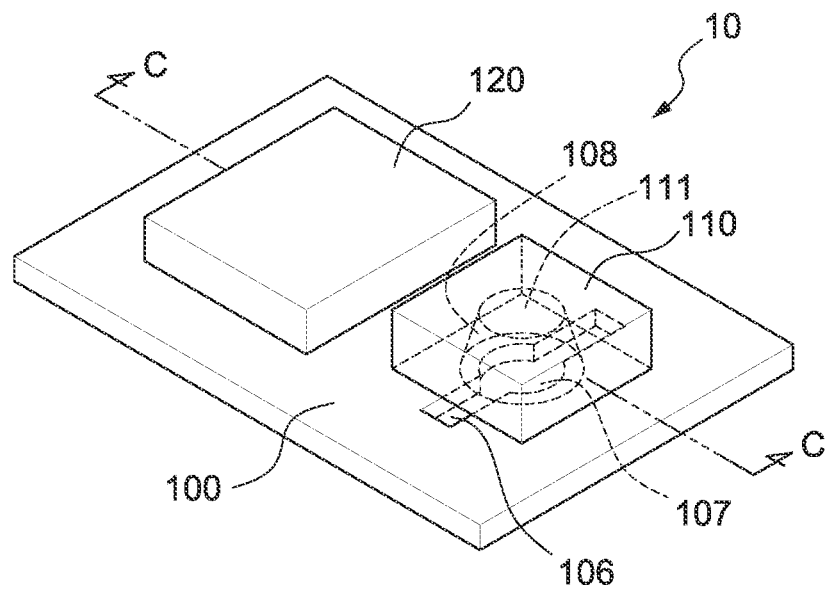
FIG. 1A illustrates a perspective view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Various embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

According to at least some embodiments of the present disclosure, a semiconductor device package includes at least one semiconductor device (e.g., a MEMS chip) including a membrane and a substrate that secures the semiconductor device. The semiconductor device and the substrate define a space that contains air. The substrate includes an air release structure that is configured to release the air from the space to an external environment of the semiconductor device package. The air release structure may include, e.g., a groove and/or a cavity. Such an air release structure prevents damages to the membrane due to expansion of the air inside of the semiconductor device package. For example, during a heating or thermal cycle process for curing an adhesive disposed between the semiconductor device and substrate, the expanded air (due to the heat) is released through the air release structure without damaging the membrane of the semiconductor device.

FIG. 1A is a perspective view of a semiconductor device package 10 in accordance with some embodiments of the present disclosure. The semiconductor device package 10 includes a substrate 100 and semiconductor devices 110 and 120 disposed on the substrate 100. The semiconductor device 110 includes a membrane 111. The substrate 100 (also referred to as "carrier") defines or includes a groove 106 and a cavity 107. The space defined by the groove 106 is connected with the space defined by the cavity 107. For example, air or fluid in the groove 106 can flow to the cavity 107 and vice versa. At least a portion of the groove 106 and/or the cavity 107 are exposed from the substrate 100. A space 108 is defined by the semiconductor device 110 and the substrate 100. The space 108 may contain, e.g., air.

During a thermal operation (e.g., heating), the air in the space 108 may expand and the cavity 107 may function as a buffer room to accommodate the expanded air. The expanded air may be released by the groove 106 which is exposed by the semiconductor device 110. For example, the expanded air in the space 108 in the semiconductor device 110 may pass through the cavity 107 and the groove 106 and may be released out of the semiconductor device package 10. Each of the cavity 107 and the groove 106 may function as an air release structure or a part of an air release structure. Thus, the groove 106 and the cavity 107 guide the flow of the expanded air out of the semiconductor device package 10 to avoid damage of the membrane 111 of the semiconductor device 110.

In some embodiments, the semiconductor device 110 may include, e.g., a MEMS package, a MEMS microphone, or a MEMS gas sensor. The semiconductor device 120 may include one or more of an application-specific integrated circuit (ASIC), a digital signal processor (DSP), a controller, a processor or other electronic components or semiconductor devices. The semiconductor device 120 (e.g., an ASIC device) may be used, for example, to collect the information obtained by the semiconductor device 110 (e.g., a MEMS device), and to transmit or process the information in an analog mode or a digital mode.

Figure 1B:
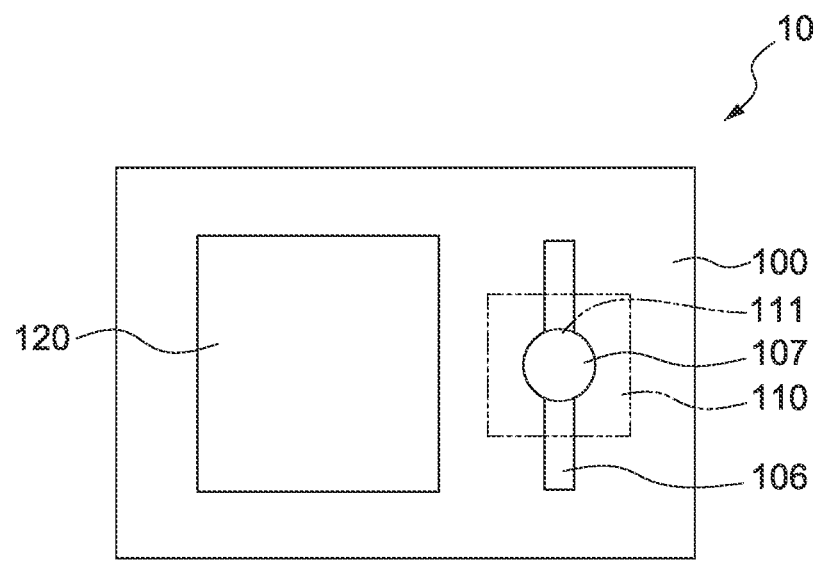
FIG. 1B illustrates a top view of a semiconductor device package according to some embodiments of the present disclosure.

FIG. 1B is a top view of the semiconductor device package 10 according to some embodiments of the present disclosure. The semiconductor device 110 is disposed on at least a portion of the groove 106. The cavity 107 may be completely or partially covered by the semiconductor device 110. The groove 106 crosses over the cavity 107. In some embodiments, the groove 106 may have a depth from approximately 5 μm to approximately 300 μm, from approximately 2 μm to approximately 500 μm, from approximately 1 μm to approximately 800 μm, or from approximately 0.1 μm to approximately 1000 μm. In some embodiments, the cavity 107 may have a depth from approximately 5 μm to approximately 300 μm, from approximately 2 μm to approximately 500 μm, from approximately 1 μm to approximately 800 μm, or from approximately 0.1 μm to approximately 1000 μm. In some embodiments, the width of the cavity 107 is substantially equal to the width of the membrane 111.

Figure 1C:
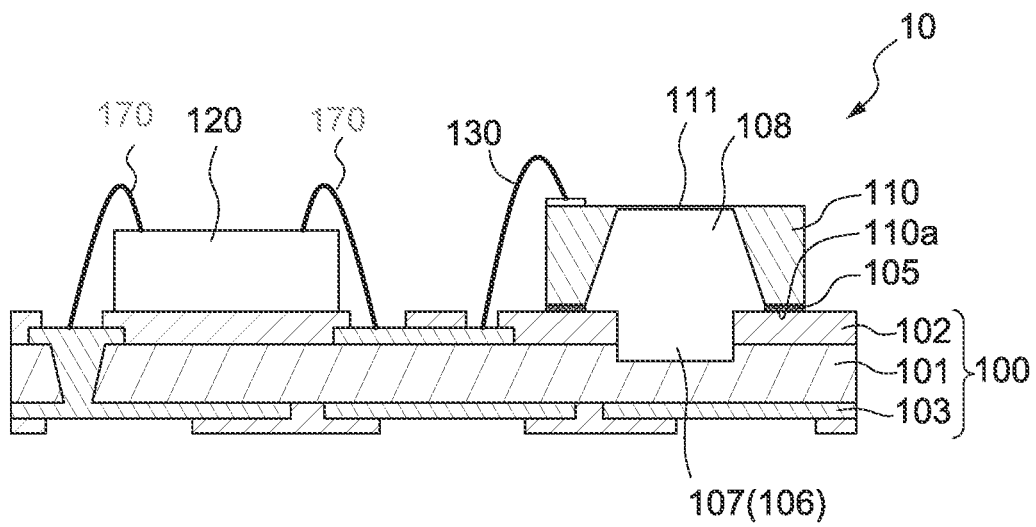
FIG. 1C illustrates a cross-sectional view of a semiconductor device package according to some embodiments of the present disclosure.

FIG. 1C is a cross-sectional view of the semiconductor device package 10 along the line C-C shown in FIG. 1A, according to some embodiments of the present disclosure. The substrate 100 includes a core layer 101, one or more insulation layers 102, and one or more conductive layers 103. In some embodiments, the groove 106 and/or the cavity 107 may be formed in the insulation layer 102 and the core layer 101. In some other embodiments, the groove 106 and the cavity 107 may be formed in the insulation layer 102 without extending into the core layer 101. In some embodiments, the core layer 101 may be made of, or include, a bismaleimide-triazine (BT) resin or a glass-reinforced epoxy composite (e.g., an FR-4 grade composite).

In some embodiments, the substrate 100 may be or include, for example, a printed circuit board (PCB), such as a paper-based copper foil laminate, a composite copper foil laminate, a polymer-impregnated glass-fiber-based copper foil laminate, or a combination of one or more thereof. The substrate 100 may include an interconnection structure (e.g., including one or more conductive layers 103), such as a redistribution layer (RDL) or a grounding element. In some embodiments, the grounding element is a via that is exposed from a lateral surface of the substrate 100. In some embodiments, the grounding element is a metal layer exposed from a lateral surface of the substrate 100. In some embodiments, the grounding element is a metal trace exposed from a lateral surface of the substrate 100.

The semiconductor device 110 has a bottom surface 110a and the membrane 111. The membrane 111 is opposite to the bottom surface 110a and is exposed by the bottom surface 110a. The semiconductor device 110 may be disposed on the substrate 100 by, e.g., an adhesive 105. In some embodiments, the width of the cavity 107 is substantially equal to the width of the membrane 111. In some embodiments, the depth of the cavity 107 is substantially equal to the depth of the groove 106 (e.g., along a vertical direction). In some other embodiments, the width of the cavity 107 may be different from the width of the membrane 111. The space 108 is defined by the membrane 111 of the semiconductor device 110 and the substrate 100 and contains, e.g., air.

The semiconductor device package 10 may include one or more bonding wires 130. The bonding wire 130 electrically connects the semiconductor device 110 to at least one conductive layer 103 of the substrate 100. One or more bonding wires 170 electrically connect the semiconductor device 120 to at least one conductive layer 103 of the substrate 100.

Figure 1D:
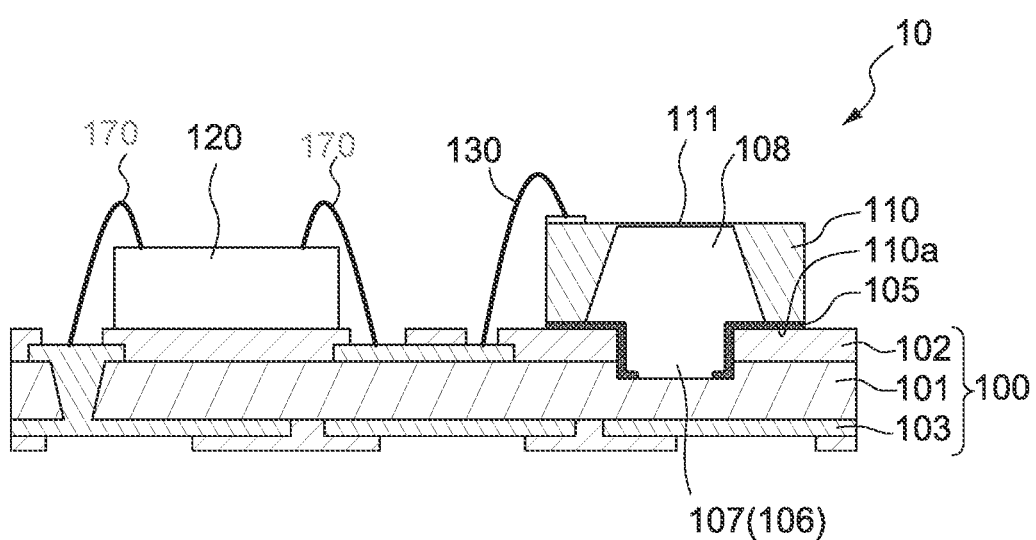
FIG. 1D illustrates a cross-sectional view of a semiconductor device package according to some embodiments of the present disclosure.

FIG. 1D is a cross-sectional view of the semiconductor device package 10 along the line C-C shown in FIG. 1A, according to some embodiments of the present disclosure. Except that the adhesive 105 extends into the groove 106 and/or the cavity 107, the structure of FIG. 1D is similar to that of FIG. 1C.

Figure 2A:
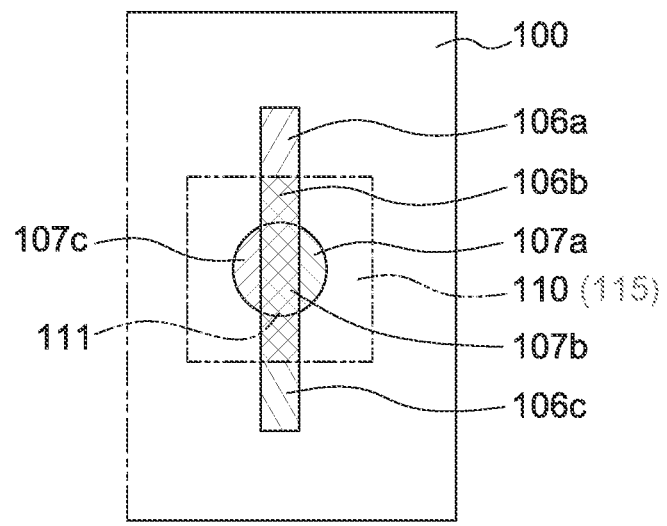
FIG. 2A illustrates a top view of a semiconductor device package according to some embodiments of the present disclosure.

FIG. 2A illustrates a top view of a region of the semiconductor device 110 of the semiconductor device package 10 according to some embodiments of the present disclosure. The substrate 100 includes a semiconductor device mounting area 115 for mounting the semiconductor device 110. In some embodiments, the semiconductor device mounting area 115 may be on the core layer 101 of the substrate 100. The substrate further includes the groove 106. The groove 106 may be disposed on the core layer 101 as well. The groove 106 includes a first portion 106a, a second portion 106b, and a third portion 106c. The second portion 106b is laterally disposed between the first portion 106a and the third portion 106c. The first portion 106a, the second portion 106b, and the third portion 106c are exposed from the substrate 100. The first portion 106a, the second portion 106b, and the third portion 106c of the groove 106 respectively have a first depth, a second depth, and a third depth (e.g., along a vertical direction). The first depth, the second depth, and the third depth of the groove 106 have a range from approximately 5 μm to approximately 300 μm, from approximately 2 μm to approximately 500 μm, from approximately 1 μm to approximately 800 μm, or from approximately 0.1 μm to approximately 1000 μm. In an embodiment, the first depth, the second depth, and the third depth of the groove 106 may be substantially the same. In some other embodiments, the first depth, the second depth, and the third depth of the groove 106 may be different from one another. In some embodiments, the first depth and the third depth of the groove 106 may be greater than the second depth of the groove 106. In some other embodiments, the first depth and the third depth of the groove 106 may be smaller than the second depth of the groove 106.

The width of the cavity 107 may be substantially equal to the width of the membrane 111. The cavity 107 includes a first portion 107a, a second portion 107b, and a third portion 107c. The second portion 107b is laterally disposed between the first portion 107a and the third portion 107c. The second portion 107b may be overlapped with at least a portion of the second portion 106b. The first portion 107a, the second portion 107b, and the third portion 107c of the cavity 107 respectively have a first depth, a second depth, and a third depth. The first depth, the second depth, and the third depth of the cavity 107 have a range from approximately 5 μm to approximately 300 μm, from approximately 2 μm to approximately 500 μm, from approximately 1 μm to approximately 800 μm, or from approximately 0.1 μm to approximately 1000 μm. In some embodiments, the first depth, the second depth, and the third depth of the cavity 107 may be substantially the same. In some other embodiments, the first depth, the second depth, and the third depth of the cavity 107 may be different from one another. In some embodiments, the second depth of the cavity 107 may be substantially the same as the second depth of the groove 106. In some other embodiments, the second depth of the cavity 107 may be larger or smaller than the second depth of the groove 106.

Figure 2B:
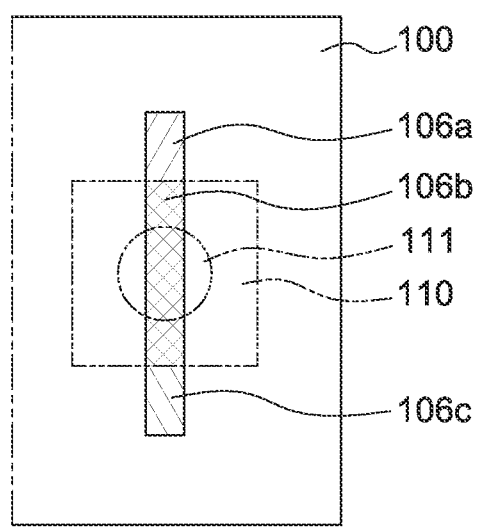
FIG. 2B illustrates a top view of a semiconductor device package according to some embodiments of the present disclosure.

In some embodiments, a substrate may include a groove but not a cavity, or include a cavity but not a groove. FIG. 2B illustrates a top view of the region of the semiconductor device 110 of the semiconductor device package 10 according to some embodiments of the present disclosure. Except that there is no cavity 107 as shown in FIG. 2B, the structure of FIG. 2B is similar to that of FIG. 2A. In other words, the substrate 100 illustrated in FIG. 2B includes the groove 106 but does not include the cavity 107.

Figure 2C:
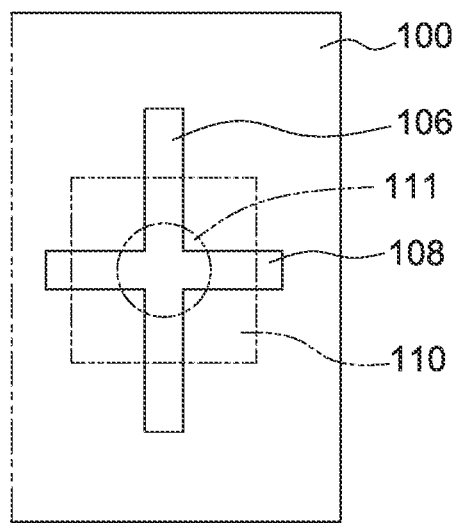
FIG. 2C illustrates a top view of a semiconductor device package according to some embodiments of the present disclosure.

In some embodiments, a substrate may include multiple grooves or multiple cavities. FIG. 2C illustrates a top view of the region of the semiconductor device 110 of the semiconductor device package 10 according to some embodiments of the present disclosure. Except that the substrate 100 further includes an additional groove 108 as shown in FIG. 2C, the structure of FIG. 2C is similar to that of FIG. 2B. The groove 108 may be substantially perpendicular to the groove 106 and the groove 108 may be disposed on the same plane as the groove 106. The groove 108 is exposed by the substrate 100 and at least a portion of the groove 108 is covered by the semiconductor device 110. In some embodiments, similar to the structure of the groove 106, the groove 108 may have three portions with respective depths. In some embodiments, the three respective depths of the groove 108 may be substantially the same. In some other embodiments, the three respective depths of the groove 108 may be different from one another. In some embodiments, the substrate 100 may omit a cavity.

Figure 2D:
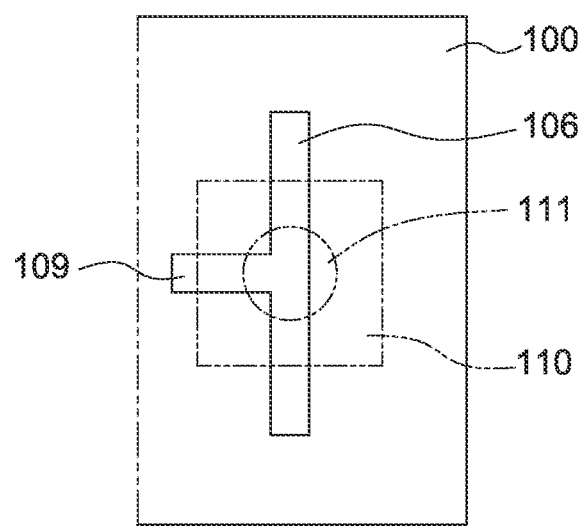
FIG. 2D illustrates a top view of a semiconductor device package according to some embodiments of the present disclosure.

FIG. 2D illustrates a top view of the region of the semiconductor device 110 of the semiconductor device package 10 according to some embodiments of the present disclosure. Except that the substrate 100 further includes an additional groove 109 as shown in FIG. 2D, the structure of FIG. 2D is similar to that of FIG. 2B. The groove 109 may be substantially perpendicular to the groove 106 and the groove 109 may be disposed on the same plane as the groove 106. The grooves 106 and 109 may be formed as a T-shape. In some embodiments, the substrate 100 illustrated in FIG. 2D may omit a cavity.

Figure 2E:
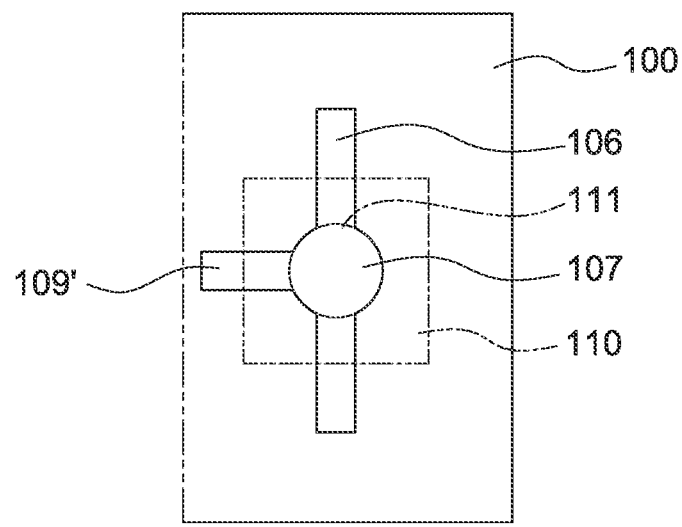
FIG. 2E illustrates a top view of a semiconductor device package according to some embodiments of the present disclosure.

In some embodiments, a cavity of a substrate may have various sizes and/or various shapes. FIG. 2E illustrates a top view of the region of the semiconductor device 110 of the semiconductor device package 10 according to some embodiments of the present disclosure. Except that the substrate 100 further includes an additional groove 109' as shown in FIG. 2E, the structure of FIG. 2E is similar to that of FIG. 2A. The grooves 106 and 109' are formed as T-shaped. In some embodiments, the substrate 100 illustrated in FIG. 2E may include a cavity 107. The width of the cavity 107 may be substantially the same as the width of the membrane 111.

Figure 2F:
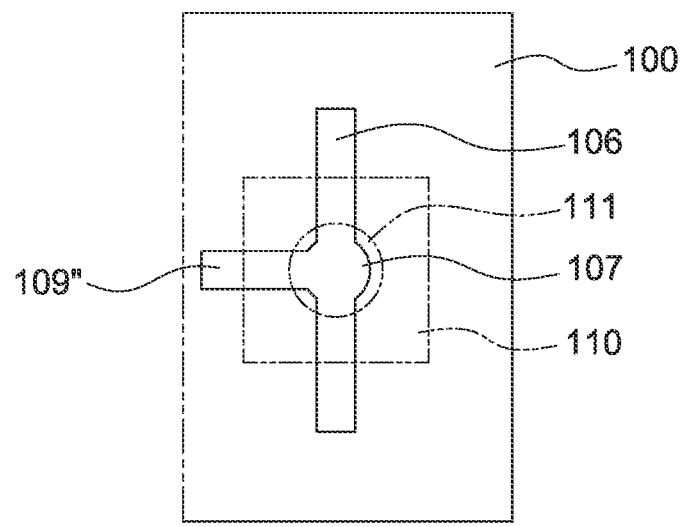
FIG. 2F illustrates a top view of a semiconductor device package according to some embodiments of the present disclosure.

FIG. 2F illustrates a top view of the region of the semiconductor device 110 of the semiconductor device package 10 according to some embodiments of the present disclosure. Except that the width of the cavity 107 is smaller than the width of the membrane 111 as shown in FIG. 2F, the structure of FIG. 2F is similar to that of FIG. 2E.

Figure 2G:
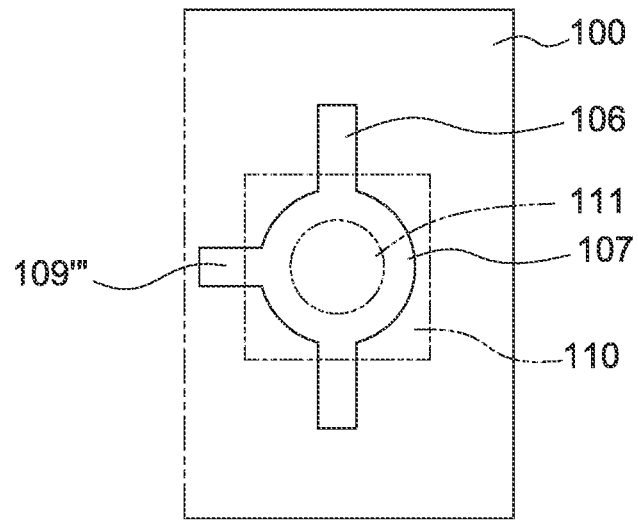
FIG. 2G illustrates a top view of a semiconductor device package according to some embodiments of the present disclosure.

FIG. 2G illustrates a top view of the region of the semiconductor device 110 of the semiconductor device package 10 according to some embodiments of the present disclosure. Except that the width of the cavity 107 is larger than the width of the membrane 111 as shown in FIG. 2G, the structure of FIG. 2G is similar to that of FIG. 2E.

Figure 3A:
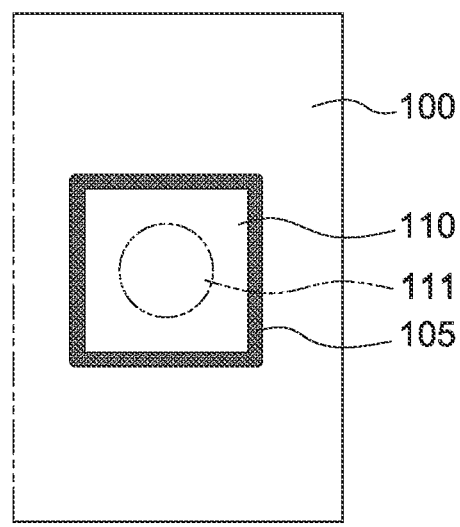
FIG. 3A illustrates a top view of a semiconductor device package according to some embodiments of the present disclosure.

In some embodiments, the adhesive 105 may be applied to one or more sides of the semiconductor device 110 in order to secure the semiconductor device 110 on the substrate 100. FIG. 3A illustrates a top view of the application of the adhesive 105 of the semiconductor device package 10 according to some embodiments of the present disclosure. As shown in FIG. 3A, the adhesive 105 may be applied to four sides (the upper side, lower side, the left side and the right side) of the semiconductor device 110 so as to secure the semiconductor device 110 on the substrate 100.

Figure 3B:
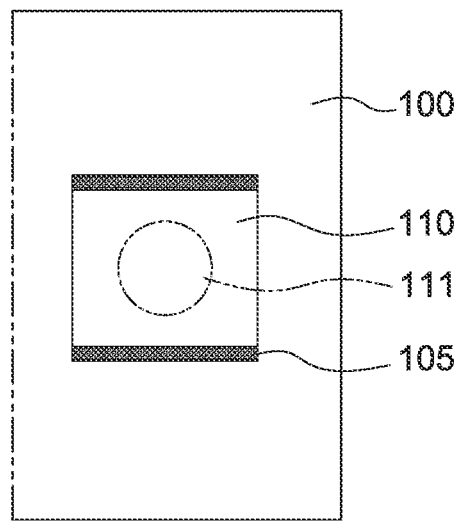
FIG. 3B illustrates a top view of a semiconductor device package according to some embodiments of the present disclosure.

FIG. 3B illustrates a top view of the application of the adhesive 105 of the semiconductor device package 10 according to some embodiments of the present disclosure. Except that the adhesive 105 may be applied to two sides (the upper side and the lower side) of the semiconductor device 110, the structure of FIG. 3B is similar to that of FIG. 3A.

Figure 3C:
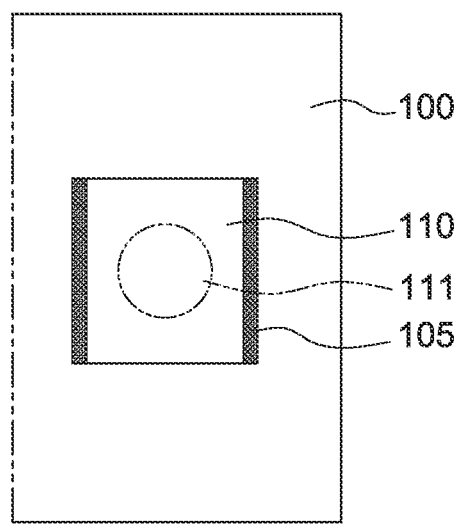
FIG. 3C illustrates a top view of a semiconductor device package according to some embodiments of the present disclosure.

FIG. 3C illustrates a top view of the application of the adhesive 105 of the semiconductor device package 10 according to some embodiments of the present disclosure. Except that the adhesive 105 may be applied to two sides (the left side and the right side) of the semiconductor device 110, the structure of FIG. 3C is similar to that of FIG. 3A.

Figure 3D:
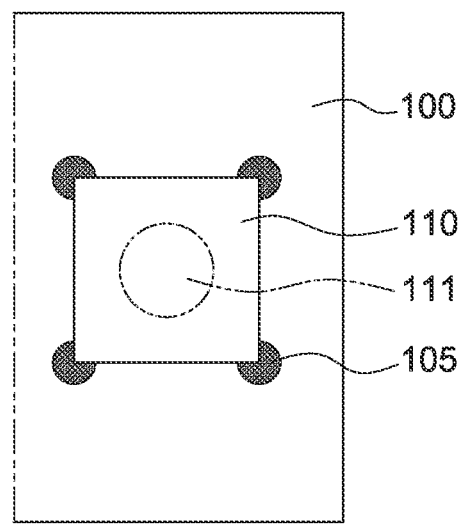
FIG. 3D illustrates a top view of a semiconductor device package according to some embodiments of the present disclosure.

FIG. 3D illustrates a top view of the application of the adhesive 105 of the semiconductor device package 10 according to some embodiments of the present disclosure. The adhesive 105 is stamped to four corners (top-left corner, top-right corner, bottom-left corner and bottom-right corner) of the semiconductor device 110 so as to reduce a glue-bleeding effect.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
   a substrate defining a groove and including a surface exposing the groove;
   a first semiconductor device disposed on the surface of the substrate, and
   an adhesive disposed between the first semiconductor device and the substrate, wherein the substrate comprises a core layer in contact with the adhesive,
   wherein the groove is partially covered by the first semiconductor device and partially exposed from the first semiconductor device, and the groove is configured to release air from inside of the first semiconductor device to outside of the semiconductor device package.

2. The semiconductor device package of claim 1, wherein the groove includes at least three portions exposed from the first semiconductor device, and wherein a first one of the at least three portions has a first length and a second one of the at least three portions has a second length different from the first length.

3. The semiconductor device package of claim 1, wherein a first portion of the groove is substantially perpendicular to a second portion of the groove, and wherein a length of the first portion of the groove is different from a length of the second portion.

4. The semiconductor device package of claim 3, wherein the second portion and a third portion of the groove are substantially arranged along a straight line and the length of the second portion and the length of the third portion of the groove are substantial identical, and wherein the length of the second portion or the third portion is greater than the length of the first portion.

5. A semiconductor device package, comprising:
a substrate comprising a core layer, an insulation layer, and a conductive layer, the substrate including a recess structure recessed from a top surface of the insulation layer toward the core layer;
a MEMS device disposed on the substrate;
an adhesive disposed between the MEMS device and the substrate, the adhesive being in contact with a lateral side of the recess structure; and
wherein a top surface of the core layer is lower than a top surface of the conductive layer, and the MEMS device covers the top surface of the core layer.

6. The semiconductor device package of claim 5, wherein the insulation layer includes a portion neither overlapping the MEMS device nor the conductive layer from a cross-sectional view.

7. The semiconductor device package of claim 5, wherein the substrate further comprises a via penetrating the substrate, and the via has a first end at a side of the core layer in proximity to the MEMS device and a second end opposite to the first end, and wherein a width of the first end of the via is greater than a width of the second end of the via.

8. The semiconductor device package of claim 5, wherein one end of the adhesive is higher than the top surface of the conductive layer, and the other end of the adhesive is lower than a bottom surface of the conductive layer from a cross-sectional view.

9. The semiconductor device package of claim 5, wherein one end of the adhesive is higher than the top surface of the insulation layer, and the other end of the adhesive is lower than a bottom surface of the insulation layer from a cross-sectional view.

10. The semiconductor device package of claim 9, wherein the adhesive is in contact with the core layer of the substrate.

11. The semiconductor device package of claim 9, wherein the adhesive is in contact with a top surface and a lateral surface of the insulation layer.

12. A semiconductor device package, comprising:
a substrate comprising a core layer and an insulation layer;
a MEMS device disposed on the substrate; and
a semiconductor device disposed side by side with the MEMS device on the substrate,
wherein a bottom surface of the insulation layer is higher than a top surface of the core layer, and the MEMS device covers the top surface of the core layer,
wherein a top surface of the MEMS device is higher than a top surface of the substrate,
wherein the semiconductor device is electrically connected to a conductive layer of the substrate through a first bonding wire, and a level of a first end of the first bonding wire is lower than a level of a membrane of the MEMS device and higher than a bottom surface of the MEMS device, and wherein a level of a second end of the first bonding wire is lower than the bottom surface of the MEMS device, the first end of the first bonding wire is more adjacent to the semiconductor device than to the conductive layer.

13. The semiconductor device package of claim 12, wherein a third portion of the insulation layer in the second region is between the semiconductor device and the core layer.

14. The semiconductor device package of claim 12, further including a first region, a second region, and a third region between the first region and the second region, wherein the MEMS device is disposed in the first region and the semiconductor device is disposed in the second region, and wherein a first portion of the insulation layer in the first region is separated from a second portion of the insulation layer in the third region in a cross sectional view.

15. The semiconductor device package of claim 12, wherein the MEMS device is electrically connected to the conductive layer of the substrate through a second bonding wire, and wherein the semiconductor device is electrically connected to the MEMS device through the second bonding wire.

16. The semiconductor device package of claim 15, wherein the level of the first end of the first bonding wire is different from a level of a first end of the second bonding wire, and wherein the level of the first end of the first bonding wire is substantially the same as a level of a second end of the second bonding wire.

* * * * *